(12) United States Patent
Usui et al.

(10) Patent No.: US 7,944,053 B2
(45) Date of Patent: May 17, 2011

(54) SEMICONDUCTOR DEVICE AND METHOD OF MANUFACTURING THE SAME

(75) Inventors: Takamasa Usui, Selkirk, NY (US);
Tadayoshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 12/276,796

(22) Filed: Nov. 24, 2008

(65) Prior Publication Data
US 2009/0134517 A1    May 28, 2009

(30) Foreign Application Priority Data
Nov. 28, 2007    (JP) .................................. 2007-307745

(51) Int. Cl.
*H01L 23/48* (2006.01)
(52) U.S. Cl. ........ 257/751; 257/750; 257/758; 257/774; 257/E23.16; 257/E21.584
(58) Field of Classification Search .................. 257/751, 257/E23.16, E21.584, 750, 758, 774; 438/627, 438/643, 653
See application file for complete search history.

(56) References Cited

U.S. PATENT DOCUMENTS

| | | | |
|---|---|---|---|
| 6,452,276 B1 * | 9/2002 | Cohen et al. ................ | 257/763 |
| 7,119,439 B2 * | 10/2006 | Watanabe et al. ............ | 257/751 |
| 7,538,434 B2 * | 5/2009 | Shih et al. .................... | 257/751 |
| 2006/0151887 A1 | 7/2006 | Oh et al. | |
| 2008/0057704 A1 | 3/2008 | Koike et al. | |

FOREIGN PATENT DOCUMENTS

JP        2006-5010        1/2006

OTHER PUBLICATIONS

T. Watanabe, et al., "Self-Formed Barrier Technology Using CuMn Alloy Seed for Copper Dual-Damascene Interconnect with Porous-SiOC/ Porous PAr Hybrid Dielectric", IEEE IITC Proceeding, Jun. 2-4, 2007, 3 pages.

* cited by examiner

*Primary Examiner* — Jasmine J Clark
(74) *Attorney, Agent, or Firm* — Oblon, Spivak, McClelland, Maier & Neustadt, L.L.P.

(57) ABSTRACT

A first insulating film is formed on a semiconductor substrate. A first interconnection is formed in a trench formed in the first insulating film. A first barrier film is formed between the first interconnection and first insulating film. A second insulating film is formed on the upper surface of the first interconnection, and in a first hollow portion between the side surface of the first barrier film and the first insulating film. The second insulating film is formed from the upper surface of the first interconnection to a depth higher than the bottom surface of the first interconnection. The first hollow portion is formed below the bottom surface of the second insulating film.

17 Claims, 8 Drawing Sheets

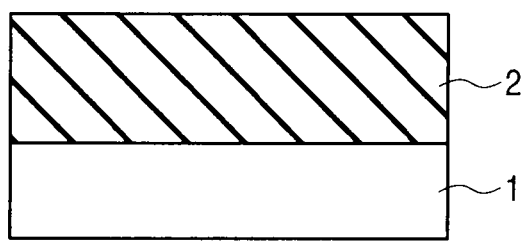
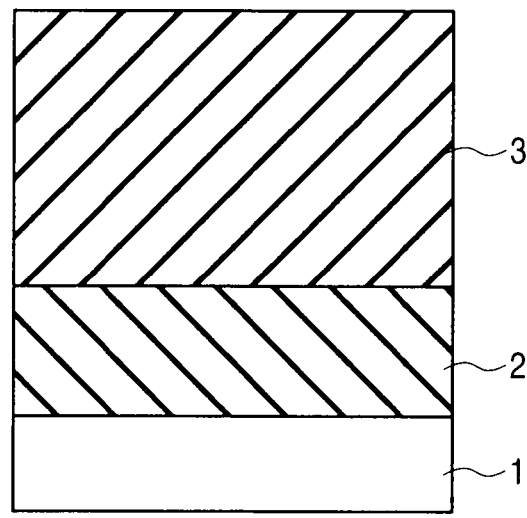
FIG. 1A          FIG. 1B
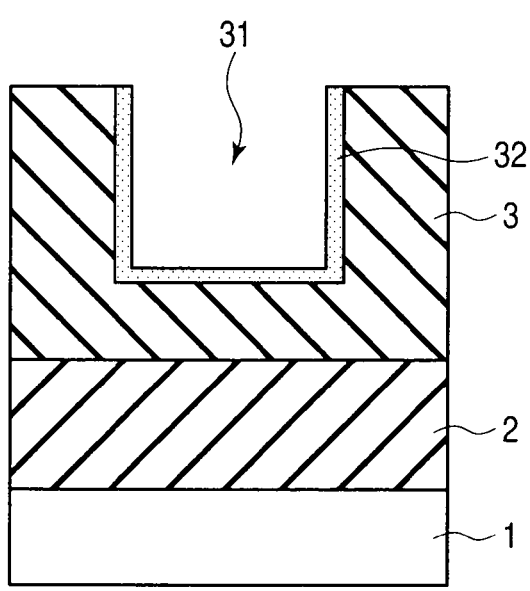
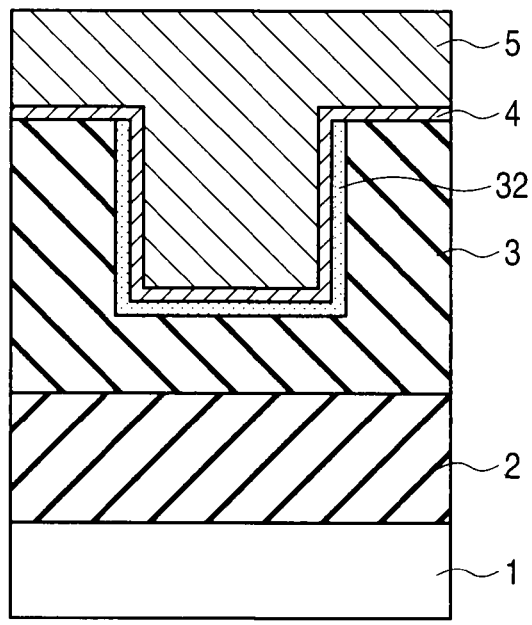
FIG. 1C          FIG. 1D

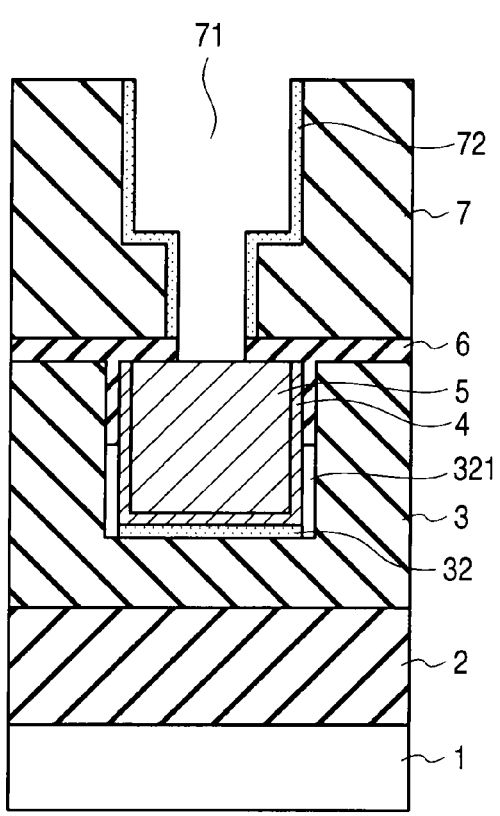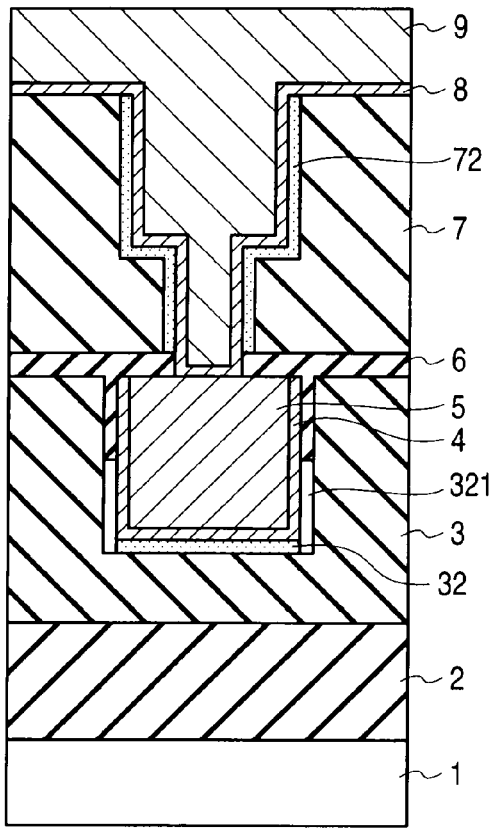
F I G. 3A    F I G. 3B
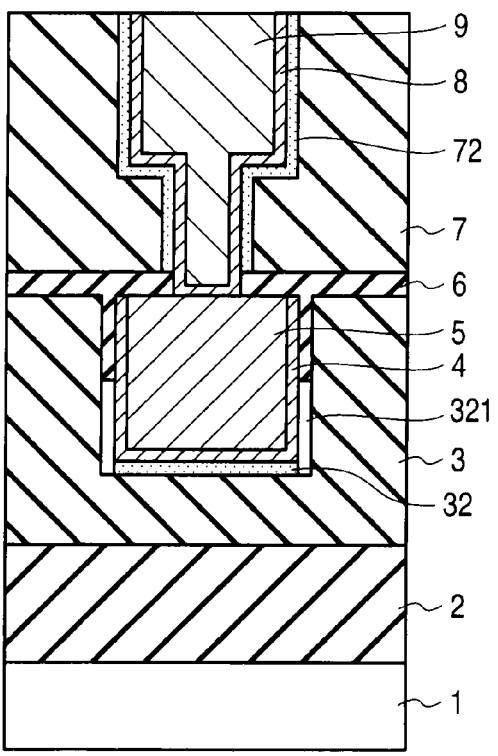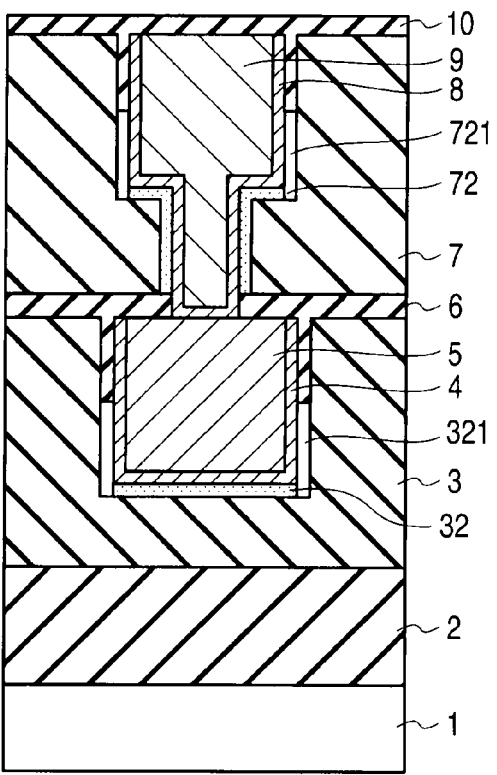
F I G. 3C    F I G. 3D

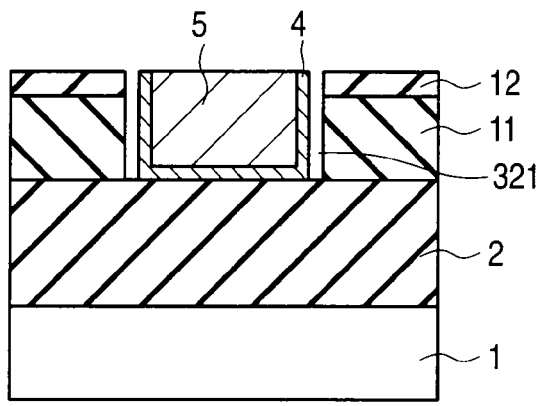
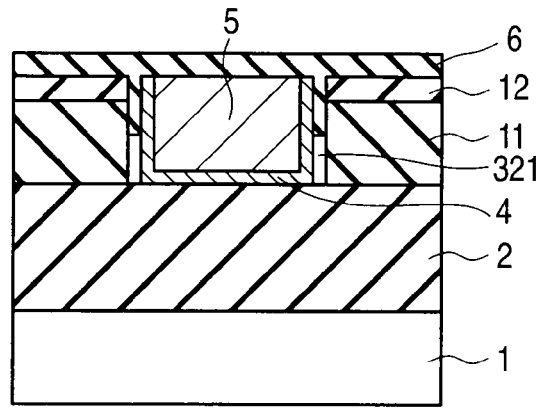
FIG. 5A    FIG. 5B
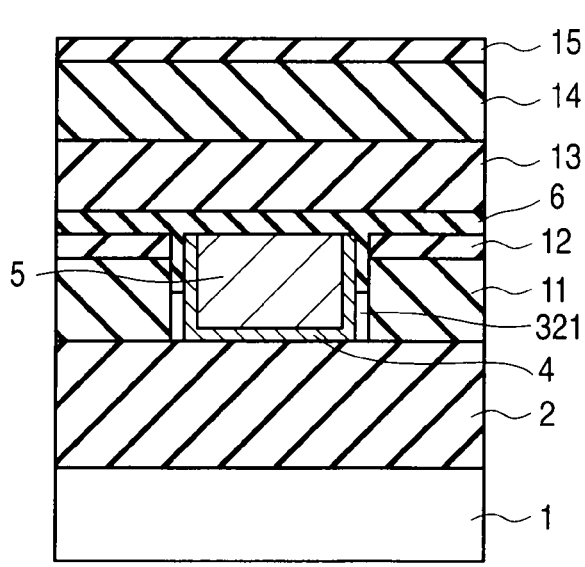
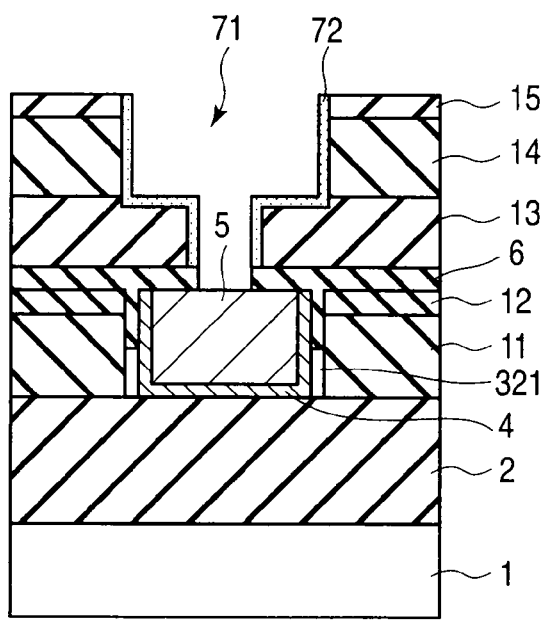
FIG. 5C    FIG. 5D

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2007-307745, filed Nov. 28, 2007, the entire contents of which are incorporated herein by reference.

BACKGROUND OF THE INVENTION

1. Field of the Invention

An LSI multilayered interconnection generally has a structure in which a barrier metal is formed on the side surfaces and bottom surface of a copper (Cu) film as an interconnection so as to surround the Cu film.

2. Description of the Related Art

Note that JP. 2006-5010 describes a semiconductor device having a multilayered interconnection structure using a porous low-k film as an interlayer dielectric film, and a method of manufacturing the device.

BRIEF SUMMARY OF THE INVENTION

According to a first aspect of the present invention, there is provided a semiconductor device comprising: a semiconductor substrate; a first insulating film formed on the semiconductor substrate; a first interconnection formed in a trench formed in the first insulating film; a first barrier film formed between the first interconnection and the first insulating film; and a second insulating film formed on an upper surface of the first interconnection, and formed in a first hollow portion between a side surface of the first barrier film and the first insulating film, the second insulating film being formed from the upper surface of the first interconnection to a depth higher than a bottom surface of the first interconnection, and the first hollow portion being formed below a bottom surface of the second insulating film.

According to a second aspect of the present invention, there is provided a semiconductor device comprising: a semiconductor substrate; a first insulating film formed on the semiconductor substrate; a second insulating film formed on the first insulating film; a first interconnection formed in a trench formed in the first insulating film and the second insulating film; a first barrier film formed between the first interconnection and the first insulating film and the second insulating film; and a third insulating film formed on an upper surface of the first interconnection, and also formed in a first hollow portion between a side surface of the first barrier film and the first insulating film and the second insulating film, the third insulating film being formed from the upper surface of the first interconnection to a depth higher than a bottom surface of the first interconnection, and the first hollow portion being formed below the third insulating film.

According to a third aspect of the present invention, there is provided a semiconductor device manufacturing method comprising: forming a first insulating film on a semiconductor substrate; forming a trench in the first insulating film; forming a barrier film on a side and bottom surface of the trench; forming an interconnection on the barrier film in the trench; and forming a hollow portion between the barrier film and the first insulating film by removing a low-carbon (C)-concentration portion of the first insulating film which exists near a side surface of the barrier film.

BRIEF DESCRIPTION OF THE SEVERAL VIEWS OF THE DRAWING

FIGS. 1A to 1D, 2A to 2D, and 3A to 3D are sectional views showing the manufacturing process of a semiconductor device according to a first embodiment;

FIGS. 4A to 4E, 5A to 5D, and 6A to 6D are sectional views showing the manufacturing process of a semiconductor device according to a second embodiment;

DETAILED DESCRIPTION OF THE INVENTION

Figure 2A:
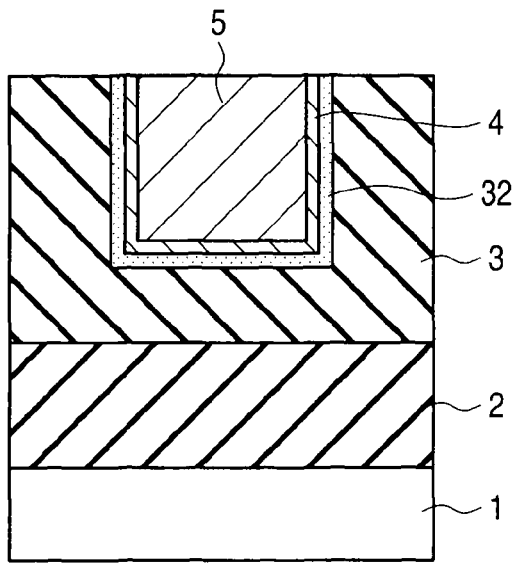

Embodiments will be explained below with reference to the accompanying drawing.

First Embodiment

The first embodiment uses Cu as an interconnection, and low-k SiOC as a layer in which a via hole and the interconnection are formed.

As shown in FIG. 1A, a 50-200 nm thick $SiO_2$ film (insulating film) 2 is deposited on a silicon (Si) substrate (semiconductor substrate) 1 by plasma CVD. Then, as shown in FIG. 1B, a 100-300 nm thick, low-k SiOC film (insulating film) 3 is deposited on the $SiO_2$ film 2 by plasma CVD.

As shown in FIG. 1C, a trench 31 for an interconnection is formed in the SiOC film 3 by plasma etching. In this step, a portion 32 in which the C (carbon) concentration is made lower than that in other portions of the SiOC film 3 by plasma damage is formed on the sidewalls and bottom surface of the interconnection trench 31. The thickness of the portion 32 is 2-10 nm.

As shown in FIG. 1D, a 5-15 nm thick barrier metal (barrier film) 4 made of Ti or Ta is deposited on the SiOC film 3 and in the interconnection trench 31 by sputtering. In addition, a Cu film is deposited on the barrier metal 4 by sputtering, and another Cu film is formed on the former Cu film by plating, thereby forming a 1-2 μm thick Cu film 5.

As shown in FIG. 2A, the Cu film 5 on the SiOC film 3 is polished by CMP (Chemical Mechanical Polishing) and left in the trench 31. After this step, an upper edge of the low-C-concentration portion 32 is exposed.

Figure 2B:
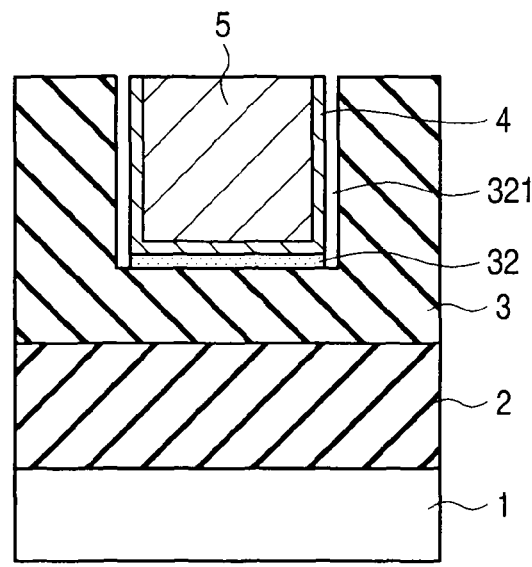

As shown in FIG. 2B, the low-C-concentration portion 32 on the side surfaces of the barrier metal 4 is dissolved away by a weak acid, thereby forming gaps 321 (hollows or air gaps) between the side surfaces of the barrier metal 4 and the SiOC film 3.

Figure 2C:
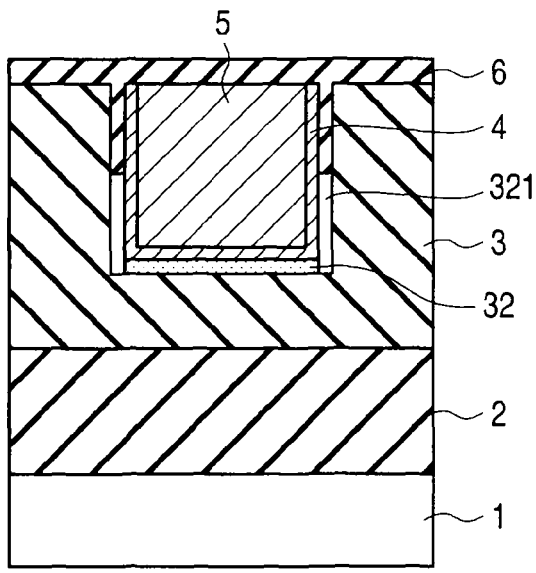

As shown in FIG. 2C, a 15-50 nm thick diffusion barrier film (insulating film) 6 made of, e.g., SiCN or SiC as a generally used material is deposited on the SiOC film 3 and Cu film (interconnection) 5 by coating or ALD. In this step, the diffusion barrier film 6 is filled in the gaps 321 to a depth of about ½ the thickness of the Cu film 5. In other words, the diffusion barrier film 6 is formed from the upper surface of the Cu film 5 to a depth higher than the bottom surface of the Cu film 5, so the gaps 321 remain below the bottom surface of the diffusion barrier film 6.

Figure 2D:
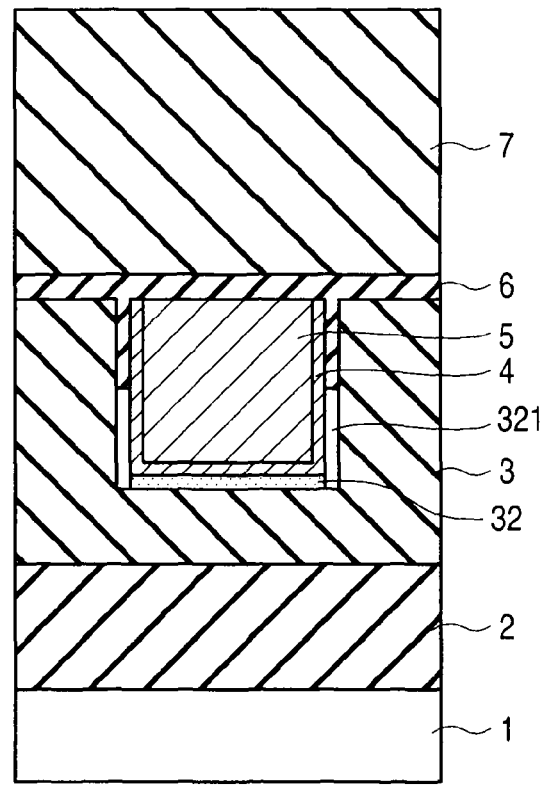

As shown in FIG. 2D, a 50-150 nm thick, low-k SiOC film (insulating film) 7 is deposited on the diffusion barrier film 6 by plasma CVD. Then, as shown FIG. 3A, a via hole and a trench 71 for an upper interconnection are formed in the SiOC film 7 by plasma etching. In this step, a portion 72 in which the C concentration is made lower than that in other portions of the SiOC film 7 by plasma damage is formed in the via hole, on the sidewalls and bottom surface of the upper interconnection trench 71, and on the sidewalls of the trench of the via hole. The thickness of the portion 72 is 2-5 nm. The material of the diffusion barrier film 6 is desirably selected so as to increase the selectivity of the SiOC film 7 to the diffusion barrier film 6.

As shown in FIG. 3B, a 5-15 nm thick barrier metal (barrier film) 8 made of Ti or Ta is deposited on the SiOC film 7 and in the via hole and upper interconnection trench 71 by sputtering. In addition, a Cu film (seed Cu film) is deposited on the barrier metal 8 by sputtering, and another Cu film is formed on the seed Cu film by plating, thereby depositing a 1-2 µm thick Cu film 9. After that, as shown in FIG. 3C, the Cu film 9 on the SiOC film 7 is polished by CMP and is formed in the trench 71. An upper edge of the low-C-concentration portion 72 is exposed. Then, the low-C-concentration portion 72 on the side surfaces of the barrier metal 8 are dissolved away by a weak acid, thereby forming gaps (hollows) between the side surfaces of the barrier metal 8 and the SiOC film 7.

As shown in FIG. 3D, a 15-50 nm thick diffusion barrier film (insulating film) 10 made of, e.g., SiCN or SiC as a generally used material is deposited on the SiOC film 7 and Cu film (interconnection) 9 by coating or ALD. In this step, the diffusion barrier film 10 is filled in gaps 721 to a depth of about ½ the thickness of the Cu film 9. In other words, the diffusion barrier film 10 is formed from the upper surface of the Cu film 9 to a depth higher than the bottom surface of the Cu film 9, so the gaps 721 remain below the bottom surface of the diffusion barrier film 10.

In the interconnection structure thus formed, the low-C-concentration portions 32 and 72 which are formed on the sidewalls of the interconnection trenches 31 and 71 formed in the SiOC films 3 and 7 and readily adsorb moisture are removed. This makes it possible to suppress oxidation of the barrier metals 4 and 8 by moisture and reduce the capacitance of the SiOC film. Also, when stacking an insulating film on the diffusion barrier film 6 and forming a via hole in this insulating film by the damascene method, if misalignment occurs between the via hole and lower interconnection 5, no gap-like shape may be formed on the sidewalls of the lower interconnection because the gaps are filled with the diffusion barrier film. When the structure as described above is used, therefore, in a multilayered interconnection Cu leak from any Cu interconnection in multilayer may be reduced.

Note that in the above first embodiment, the diffusion barrier film is filled in the gaps 321 or 721 between the barrier metal and low-k SiOC film to a depth of about ½ the thickness of the Cu film. However, the depth of filling can be determined by adjusting the source gas amount and the plasma output. This depth may be a depth by which the diffusion barrier film 6 or 10 is not completely filled in the gaps 321 or 721, i.e., a depth smaller than the thickness of the Cu film. The depth may also be smaller than or equal to or larger than ½ the thickness of the Cu film. When the diffusion barrier film is filled deeper, it is possible to more reliably prevent the formation of a gap-like shape on the sidewalls of the lower interconnection if above-mentioned misalignment occurs.

Note also that in the above first embodiment, the diffusion barrier film to be formed on the Cu film 9 is filled in the gap between the barrier metal and low-k SiOC film. That is, this embodiment uses the same material as the film to be formed on the Cu film 9 and the film to be filled in the gaps. However, different materials may also be used as the film to be formed on the Cu film 9 and the film to be filled in the gaps. When the same material is used as in the first embodiment, i.e., when the film to be formed on the Cu film 9 and the film to be filled in the gaps are integrated, the film formation step need only be performed once. This makes it possible to reduce the manufacturing cost compared to the case where different materials are used.

Second Embodiment

In the second embodiment, Cu is used as an interconnection, and the dual damascene interconnection has a stacked structure including lower and upper insulating films, i.e., using low-k SiOC (the lower insulating film) as a layer in which a via hole is formed, and low-k organic $C_xH_y$ (the upper insulating film) as a layer in which the interconnection is formed. Note that in FIGS. 4A to 4E, 5A to 5D, and 6A to 6D, the same reference numerals as in FIGS. 1A to 1D, 2A to 2D, and 3A to 3D denote the same parts.

Figure 4A:
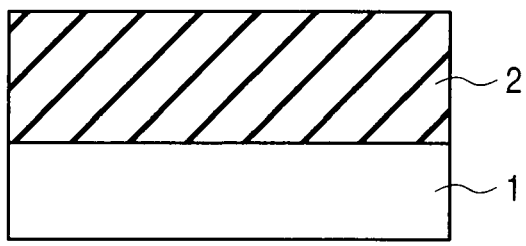
Figure 4B:
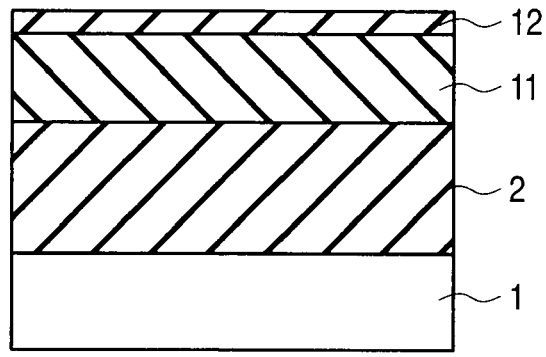

As shown in FIG. 4A, a 50-200 nm thick $SiO_2$ film 2 is deposited on an Si substrate 1 by plasma CVD. Then, as shown in FIG. 4B, a 50-100 nm thick, low-k organic $C_xH_y$ film (insulating film) 11 is deposited on the $SiO_2$ film 2 by coating. In addition, a 50-100 nm thick CMP protective film (insulating film) 12 made of low-k SiOC is deposited on the organic $C_xH_y$ film 11 by plasma CVD.

Figure 4C:
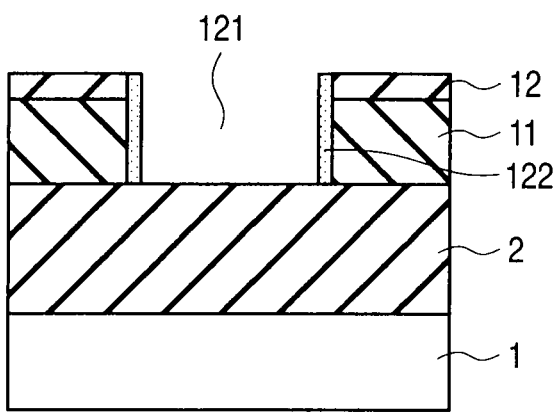

As shown in FIG. 4C, a trench 121 for an interconnection is formed in the CMP protective film 12 and organic $C_xH_y$ film 11 by plasma etching. In this step, a portion 122 in which the C concentration is made lower than that in other portions of the CMP protective film 12 and organic $C_xH_y$ film 11 by plasma damage is formed on the sidewalls of the interconnection trench 121. The thickness of the portion 122 is 2-10 nm.

Figure 4D:
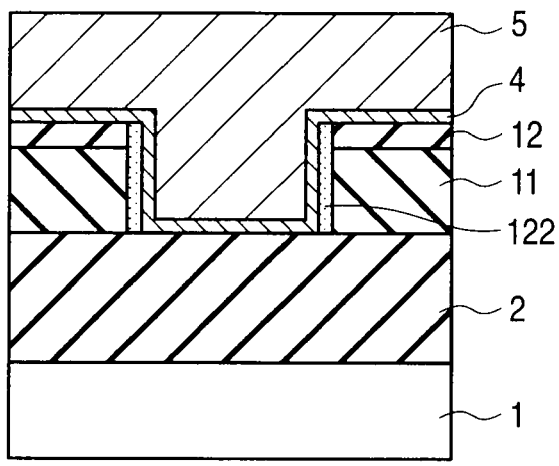

As shown in FIG. 4D, a 5-15 nm thick barrier metal (barrier film) 4 made of Ti or Ta is deposited on the CMP protective film 12 and in the interconnection trench 121 by sputtering. In addition, a seed Cu film is deposited on the barrier metal 4 by sputtering, and another Cu film is formed on the former Cu film by plating, thereby forming a 1-2 µm thick Cu film 5.

Figure 4E:
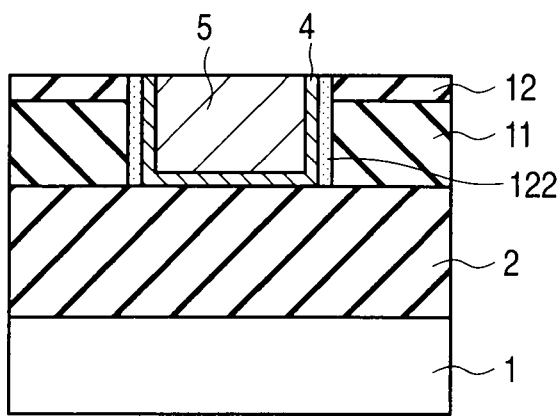

As shown in FIG. 4E, the Cu film 5 on the CMP protective film 12 is polished by CMP and is formed in the trench 121. Subsequently, as shown in FIG. 5A, the low-C-concentration portion 122 on the side surfaces of the barrier metal 4 is dissolved away by a liquid chemical, thereby forming gaps 321 (hollows or air gaps) between the side surfaces of the barrier metal 4 and the CMP protective film 12 and organic $C_xH_y$ film 11.

As shown in FIG. 5B, a 15-50 nm thick diffusion barrier film (insulating film) 6 made of, e.g., SiCN or SiC as a generally used material is deposited on the CMP protective film 12 and Cu film (interconnection) 5 by coating or ALD. In this step, the diffusion barrier film 6 is filled in the gaps 321 to a depth of about ½ the thickness of the Cu film 5.

As shown in FIG. 5C, a 50-150 nm thick, low-k SiOC film (insulating film) 13 is deposited on the diffusion barrier film 6 by plasma CVD. A via hole is formed in the SiOC film (insulating film) 13 in a later step. Then, a 50-100 nm thick, low-k organic $C_xH_y$ film (insulating film) 14 is deposited on the SiOC film 13 by coating. An interconnection is formed in the organic $C_xH_y$ film (insulating film) 14 in a later step. Furthermore, a 50-200 nm thick CMP protective film (insulating film) 15 made of low-k SiOC is deposited on the organic $C_xH_y$ film 14 by plasma CVD.

As shown FIG. 5D, a via hole and a trench 71 for an upper interconnection are formed in the diffusion barrier film 6, SiOC film 13, organic $C_xH_y$ film 14, and CMP protective film 15 by plasma etching. In this step, a portion 72 in which the C concentration is made lower than that in other portions of the CMP protective film 15, organic $C_xH_y$ film 14, and SiOC film 13 by plasma damage is formed in the via hole, on the sidewalls and bottom surface of the upper interconnection trench 71, and on the sidewalls of the via hole. The thickness of the portion 72 is 2-10 nm.

Figure 6A:
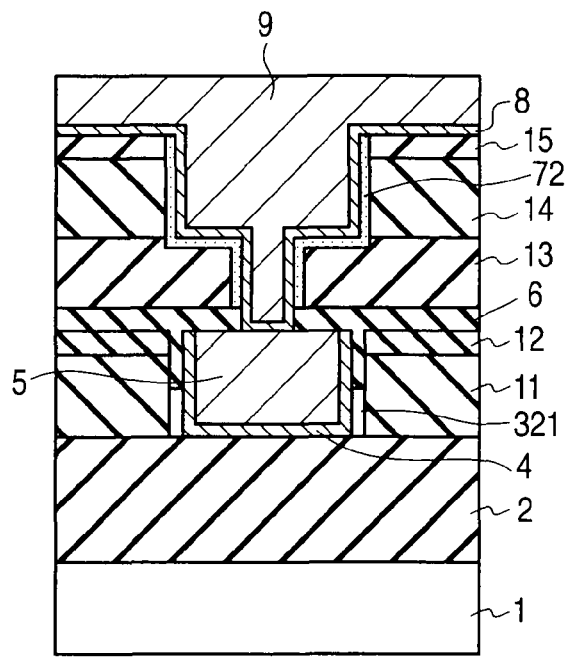

As shown in FIG. 6A, a 5-15 nm thick barrier metal (barrier film) 8 made of Ti or Ta is deposited on the CMP protective film 15 and in the via hole and upper interconnection trench 71 by sputtering. In addition, a Cu film is deposited on the barrier metal 8 by sputtering, and another Cu film is formed on the former Cu film by plating, thereby forming a 1-2 μm thick Cu film 9.

Figure 6B:
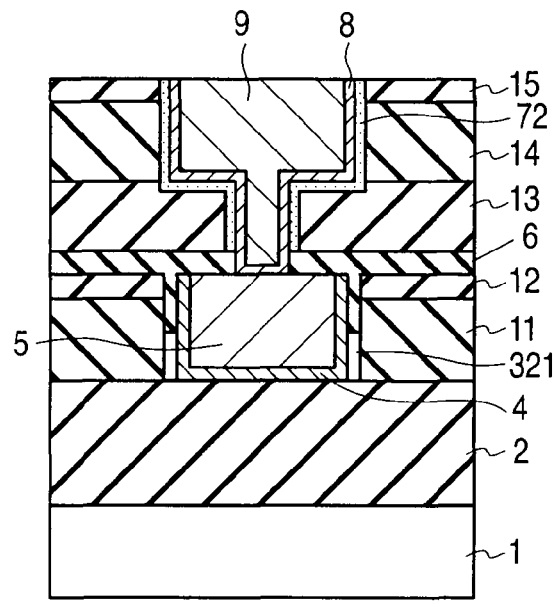
Figure 6C:
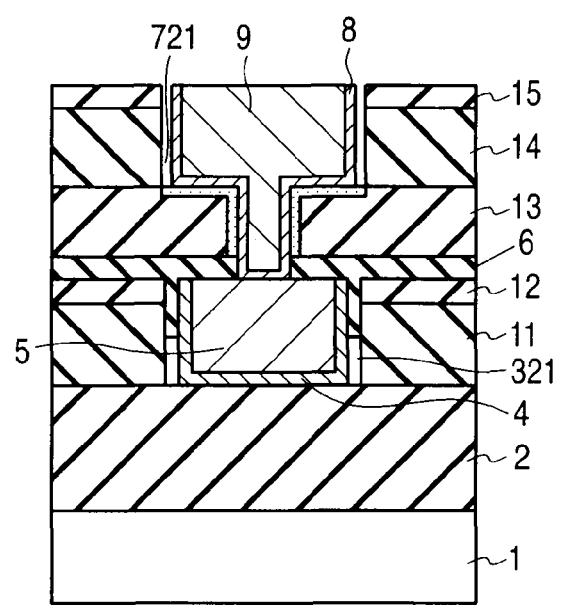

As shown in FIG. 6B, the Cu film 9 on the CMP protective film 15 is polished by CMP and left behind in only the trench 71. Subsequently, as shown in FIG. 6C, the low-C-concentration portion 72 on the side surfaces of the barrier metal 8 are dissolved away by a liquid chemical, thereby forming gaps 721 (hollows or air gaps) between the side surfaces of the barrier metal 8 and the CMP protective film 15 and organic $C_xH_y$ film 14.

Figure 6D:
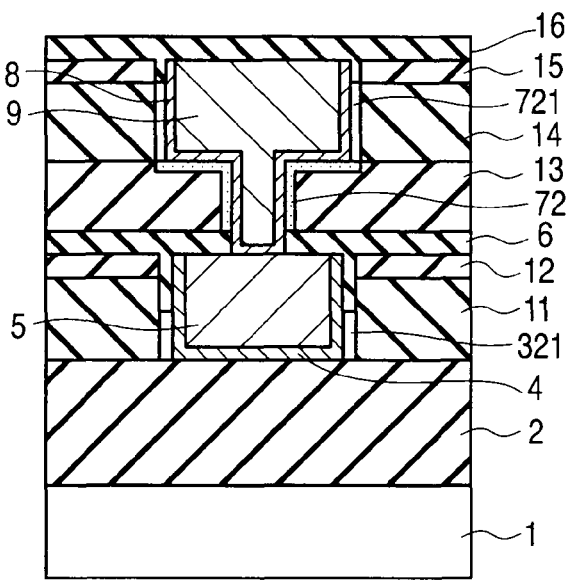

As shown in FIG. 6D, a 15-50 nm thick barrier insulating film 16 made of, e.g., SiN, SiCN, or SiC is deposited on the CMP protective film 15 and Cu film (interconnection) 9 by plasma CVD, thermal CVD, or ALD. In this step, the barrier insulating film 16 is filled in the gaps 721 to a depth almost equal to the thickness of the CMP protective film 15.

When the stacked structure of the insulating films (SiOC film and organic $C_xH_y$) is used as described above, oxidation of the barrier metals by moisture can be suppressed by removing the low-C-concentration portion on the sidewalls of the interconnection trench as in the first embodiment. Also, when stacking an insulating film on the diffusion barrier film and forming a via hole in this insulating film by the damascene method, if misalignment occurs between the via hole and lower interconnection, gap-like shape is not formed on the sidewalls of the lower interconnection because the gaps are filled with the diffusion barrier film. When the structure as described above is used, therefore, in a multilayered interconnection Cu leak from any Cu interconnection in multilayer may be reduced.

Note that in the above second embodiment, the diffusion barrier film is filled in the gap between the barrier metal and low-k SiOC film and organic $C_xH_y$ film. The depth of filling may be a depth by which the diffusion barrier film is not completely filled in the gap, i.e., a depth smaller than the thickness of the Cu film. The depth of filling can be determined by adjusting the source gas amount and the plasma output.

Third Embodiment

Figure 7A:
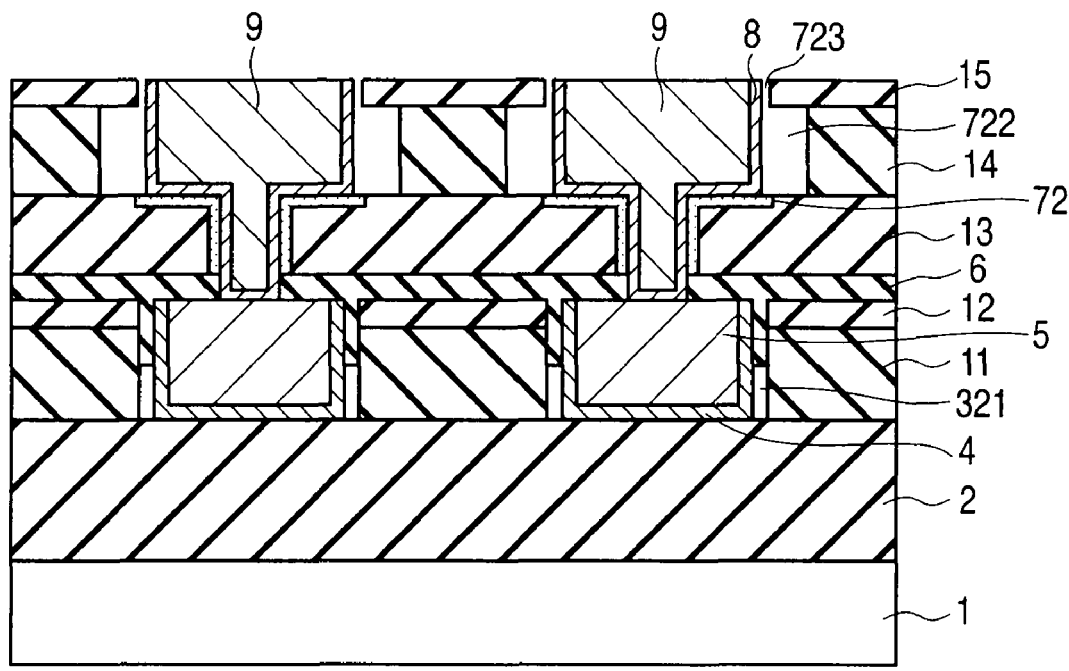
FIGS. 7A and 7B are sectional views showing the manufacturing process of a semiconductor device according to a third embodiment.
Figure 7B:
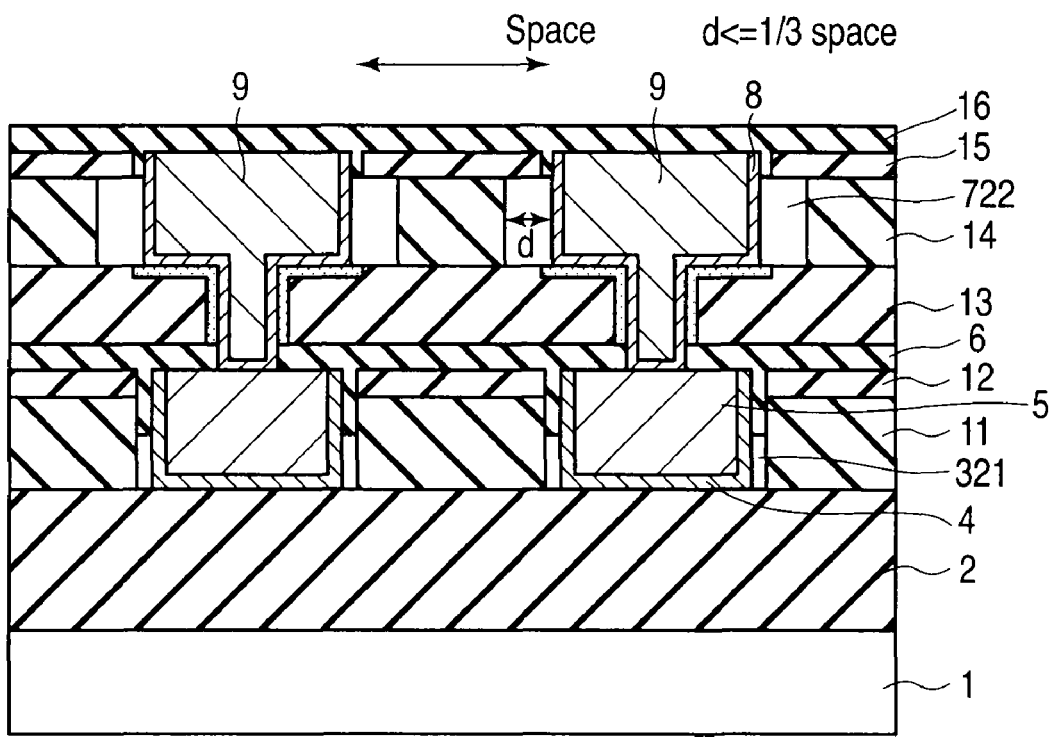

Note that in FIGS. 7A and 7B, the same reference numerals as in FIGS. 4A to 4E, 5A to 5D, and 6A to 6D denote the same parts.

In the third embodiment, the same processes as those shown in FIGS. 4A to 6C of the second embodiment are performed. After that, plasma processing is performed using a reducing gas such as $H_2$ or $NH_3$. Consequently, as shown in FIG. 7A, an organic $C_xH_y$ film (lower film) 14 near a barrier metal 8 is partially etched to form a gap 722 below a CMP protective film (upper film) 15 made of SiOC. The width of the gap 722 formed between the side surface of the barrier metal 8 and the organic $C_xH_y$ film 14 is larger than that of a gap 723 formed between the side surfaces of the barrier metal 8 and the CMP protective film 15. The width of the gap 722 is 2-3 nm, i.e., about ⅓ the distance between adjacent Cu films 9.

Then, as shown in FIG. 7B, a 15-50 nm thick barrier insulating film 16 made of, e.g., SiN, SiCN, or SiC is deposited on the CMP protective film 15 and Cu film 9 by plasma CVD. In this step, the barrier insulating film 16 is filled in the gap 723 between the side surface of the barrier metal 8 and the CMP protective film 15. In this case, the viscosity or coverage of the barrier insulating film 16 may be adjusted beforehand to such an extent that the upper portions of the sidewalls of an interconnection trench are filled.

In the interconnection structure thus formed, oxidation of the barrier metal by moisture can be suppressed by removing the low-C-concentration portion on the sidewalls of the interconnection trench, as in the first and second embodiments. In addition, the gap is formed between adjacent interconnections, although the gap is not a through air gap. This very effectively reduces the capacitance of the organic $C_xH_y$ film. Furthermore, the problem of misalignment can be solved in the same manner as in the first and second embodiments.

Note that in the third embodiment described above, the gap 722 is formed below the CMP protective film 15 made of SiOC by etching the organic $C_xH_y$ film 14 near the barrier metal 8, and the width of the gap 722 can be freely determined by adjusting the time of the plasma processing using the reducing gas.

Fourth Embodiment

In the fourth embodiment, the case where $MnO_x(Si_y)$ as a self-forming barrier material is used as the barrier material of a Cu film will be explained. Note that in FIGS. 8A to 8D, the same reference numerals as in FIGS. 1A to 1D, 2A to 2D, and 3A to 3D denote the same parts.

Figure 8A:
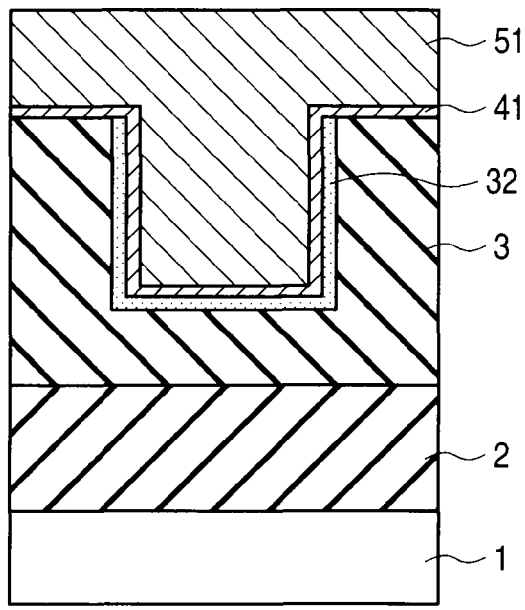
FIGS. 8A to 8D are sectional views showing the manufacturing process of a semiconductor device according to a fourth embodiment.

In the fourth embodiment, the same processes as those shown in FIGS. 1A to 1C of the first embodiment are performed. After that, as shown in FIG. 8A, self-forming barrier material 41 is formed in the trench by physical vapor deposition (PVD) or the like. A seed Cu (not shown in FIG. 8A) is formed on the material 41 by PVD or the like. A 1-2 μm thick Cu film 51 is formed on the seed Cu by plating. After that, annealing is provided so as to form a self-forming barrier material 41. A low-C-concentration portion 32 is formed between the material 41 and the SiOC film 3, on a side and bottom of the trench.

In this state, annealing (a heat treatment) is performed within the temperature range of 200° C. to 300° C. If Mn atoms or Al atoms remain in the seed Cu alloy of the Cu film 51, this annealing can form the same barrier film 41 on the outer peripheral portions, i.e., the side portions, and bottom portion of the Cu film 51. The $MnO_x(Si_y)$ and $Al_2O_3$ barriers thus formed have adhesion to Cu higher than that of a normal diffusion barrier insulating film. This makes it possible to obtain good EM characteristics in addition to the effects of the first embodiment.

Figure 8B:
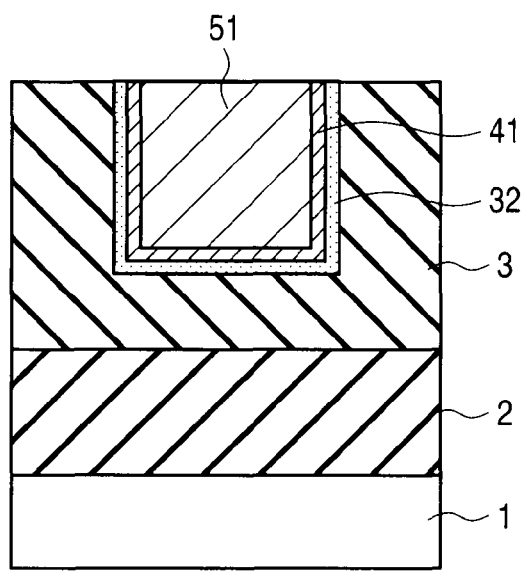
Figure 8C:
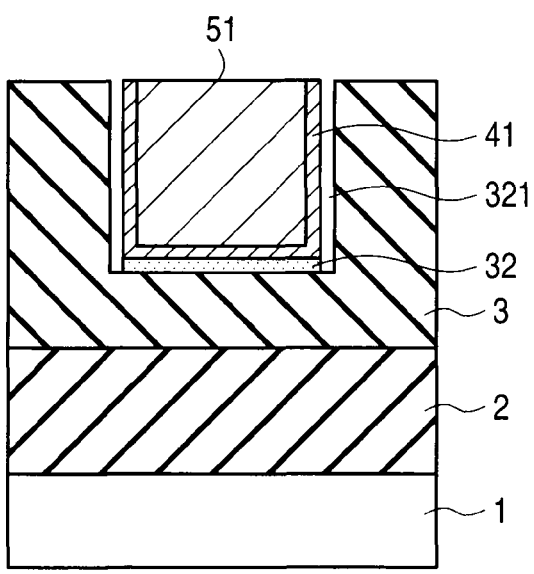

Subsequently, as shown in FIG. 8B, the Cu film 51 on the SiOC film 3 is polished by CMP and is formed in the trench. An upper edge of the low-C-concentration portion 32 is exposed. As shown in FIG. 8C, the low-C-concentration portion 32 on the side surfaces of the material 41 is dissolved away by a weak acid, thereby forming gaps 321 (hollows or air gaps) between the Cu film 51 and SiOC film 3.

Figure 8D:
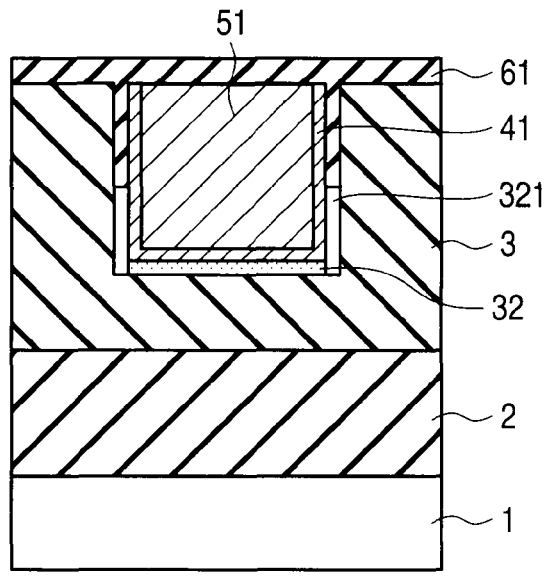

Then, as shown in FIG. 8D, a 15-50 nm thick diffusion barrier film 61 made of a silicon-containing material such as $SiC_x$ is deposited on the SiOC film 3 and Cu film (interconnection) 51 by coating or ALD. In this step, the diffusion barrier film 61 is filled in the gaps 321 to a depth of about ½ the thickness of the Cu film 51. Note that the depth of filling can be freely determined in the same manner as in the first embodiment.

Note that when $MnO_x(Si_y)$ as a self-forming barrier material is used as the barrier material of a Cu film by applying the structure of the fourth embodiment to the third embodiment, the barrier is exposed to the air gap portion, so large effects on the water penetration resistance and oxidation resistance can be expected.

Since the semiconductor device according to each embodiment of the present invention is applied to a product that operates at a high speed, the multilayered interconnection is required to decrease the value of resistance (R)×capacitance (C). For this purpose, copper (Cu) is used as an interconnection material, and a low-k insulating film is used in an insulating film portion surrounding the interconnection material. Examples of an insulating film having a particularly low dielectric constant are $SiO_xC_y$, $C_xH_y$, $SiO_xC_y$ and $C_xH_y$ containing pores, and stacked structures of these materials.

An $SiO_xC_y$ or $C_xH_y$ film is formed using the plasma process that is used when forming an interconnection or a trench for a via. In this step, the film readily suffers plasma damage (C is easily released). This phenomenon occurs on the sidewall portion of the interconnection trench. In each of the above embodiments, this portion is removed by the WET processing after CMP, and a material such as SiCN or SiC having a high etching selectivity to $SiO_xC_y$ or $C_xH_y$ is filled as an etching stopper in the portion from which the low-C-concentration portion is removed.

This makes it possible to prevent oxidation of the barrier film formed in the interconnection trench, and prevent the leak of Cu from the Cu interconnection. Accordingly, the reliability of the semiconductor device can be improved by suppressing deterioration of the transistor.

Each embodiment of the present invention can provide a semiconductor device that prevents oxidation of a barrier film surrounding an interconnection layer and prevents the leak of Cu from a Cu interconnection, and a method of manufacturing the device.

Also, the above-mentioned embodiments can be practiced not only singly but also in the form of an appropriate combination. Furthermore, the aforesaid embodiments include inventions in various stages, so inventions in various stages can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first insulating film formed on the semiconductor substrate;
   a first interconnection formed in a trench formed in the first insulating film;
   a first barrier film formed between the first interconnection and the first insulating film; and
   a second insulating film formed on an upper surface of the first interconnection, and formed in a first hollow portion between a side surface of the first barrier film and the first insulating film, the second insulating film being formed from the upper surface of the first interconnection to a depth higher than a bottom surface of the first interconnection, and the first hollow portion being formed below a bottom surface of the second insulating film.

2. The device according to claim 1, further comprising:
   a third insulating film formed on the second insulating film;
   a second interconnection formed in a trench formed in the third insulating film;
   a second barrier film formed between the second interconnection and the third insulating film; and
   a fourth insulating film formed on an upper surface of the second interconnection, and also formed in a second hollow portion between a side surface of the second barrier film and the third insulating film, the fourth insulating film being formed from the upper surface of the second interconnection to a depth higher than a bottom surface of the second interconnection, and the second hollow portion being formed below a bottom surface of the fourth insulating film.

3. The device according to claim 1, wherein the first insulating film is made of a film containing carbon (C), and a region having a carbon concentration lower than that of other portions of the first insulating film is formed in a bottom surface of the trench formed in the first insulating film.

4. The device according to claim 1, wherein the first barrier film is a self-forming barrier film formed by annealing the first interconnection.

5. The device according to claim 1, wherein the first barrier film and the second insulating film prevent diffusion of a material contained in the first interconnection.

6. The device according to claim 1, wherein the first interconnection contains a Cu film.

7. The device according to claim 2, which further comprises a via hole formed in a trench formed in the third insulating film between the first interconnection and the second interconnection, and in which the third insulating film is made of a film containing carbon (C), and a region having a carbon concentration lower than that of other portions of the third insulating film is formed in a side surface of the trench formed in the third insulating film.

8. The device according to claim 1, wherein the first insulating film is made of a film containing carbon (C), and the first hollow portion is formed by removing a low-carbon-concentration region of the first insulating film which exists near the first barrier film.

9. A semiconductor device comprising:
   a semiconductor substrate;
   a first insulating film formed on the semiconductor substrate;
   a second insulating film formed on the first insulating film;
   a first interconnection formed in a trench formed in the first insulating film and the second insulating film;
   a first barrier film formed between the first interconnection and the first insulating film and the second insulating film; and
   a third insulating film formed on an upper surface of the first interconnection, and also formed in a first hollow portion between a side surface of the first barrier film and the first insulating film and the second insulating film, the third insulating film being formed from the upper surface of the first interconnection to a depth higher than a bottom surface of the first interconnection, and the first hollow portion being formed below the third insulating film.

10. The device according to claim 9, wherein the first hollow portion includes a lower hollow portion between the side surface of the first barrier film and the first insulating film, and an upper hollow portion between the side surface of the first barrier film and the second insulating film, and a width of the lower hollow portion is larger than that of the upper hollow portion, and the third insulating film is formed in the upper hollow portion.

11. The device according to claim 9, further comprising:
a fourth insulating film formed on the third insulating film;
a fifth insulating film formed on the fourth insulating film;
a sixth insulating film formed on the fifth insulating film;
a second interconnection formed in a trench formed in the fifth insulating film and the sixth insulating film;
a second barrier film formed between the second interconnection and the fifth insulating film and the sixth insulating film; and
a seventh insulating film formed on an upper surface of the second interconnection, and also formed in a second hollow portion between a side surface of the second barrier film and the fifth insulating film and the sixth insulating film, the seventh insulating film being formed from the upper surface of the second interconnection to a depth higher than a bottom surface of the second interconnection, and the second hollow portion being formed below the seventh insulating film.

12. The device according to claim 9, which further comprises an eighth insulating film formed between the semiconductor substrate and the first insulating film, and in which an upper surface of the eighth insulating film forms a bottom surface of the trench, and the first barrier film is formed on the upper surface of the eighth insulating film.

13. The device according to claim 9, wherein the first barrier film is a self-forming barrier film formed by annealing the first interconnection.

14. The device according to claim 9, wherein the first barrier film and the third insulating film prevent diffusion of a material contained in the first interconnection.

15. The device according to claim 9, wherein the first interconnection contains a Cu film.

16. The device according to claim 9, which further comprises a via hole formed in a trench formed in the fourth insulating film between the first interconnection and the second interconnection, and in which the fourth insulating film is made of a film containing carbon (C), and a region having a carbon concentration lower than that of other portions of the fourth insulating film is formed in a side surface of the trench formed in the fourth insulating film.

17. The device according to claim 9, wherein the first insulating film and the second insulating film are each made of a film containing carbon (C), and the first hollow portion is formed by removing low-carbon-concentration regions of the first insulating film and the second insulating film which exist near the first barrier film.

* * * * *